Nov. 24, 1953

V. D. LANDON 2,660,712

BAND PASS FILTER

Filed July 27, 1949

INVENTOR
Vernon D. Landon
BY H. O. Newton
ATTORNEY

Patented Nov. 24, 1953 2,660,712

UNITED STATES PATENT OFFICE 2,660,712

BAND PASS FILTER

Vernon D. Landon, Princeton, N. J., assignor to Radio Corporation of America, a corporation of Delaware Application July 27, 1949, Serial No. 107,114

5 Claims. (Cl. 333—71)

Figure 1:
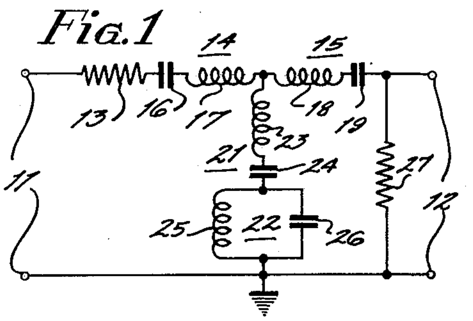

This invention relates to electrical filters and particularly to band pass filters having relatively narrow pass bands for use at medium frequencies.

One of the commonly used networks constituting a band pass filter is the so-called M-derived filter. Essentially, it consists of two series arms or branches and preferably one shunt arm or branch connected symmetrically to the series arms. When it is desired to use a filter of such character at medium frequencies such as those of the order of 500 kilocycles, it is necessary in order to provide a relatively narrow pass band that the circuit elements of the shunt arm have relatively high Q's so that the filter may have the necessary sharp cutoffs at the limiting frequencies of the pass band. At such frequencies, however, it is difficult to construct coils for use in the shunt arm of an M-derived filter which will have a sufficiently high Q to effect the desired sharp cutoff at the limiting frequencies. This is particularly true when the ratio of the mean frequency of the pass band to the band width is relatively high, such as of the order of 20.

Accordingly, it is an object of this invention to provide an improved band pass filter for use at medium frequencies which will have sharp cutoffs at the limiting frequencies in cases where it is desired that the band width be a small percentage of the mean frequency of the pass band.

Another object of the invention is to provide an improved band pass filter having fewer components than conventional filters and providing a band width which is no more than five percent of the mean frequency of the pass band.

A further object of the invention is to provide an improved band pass filter including an electro-mechanical resonator as one of the circuit elements in the shunt arm of an equivalent M-derived filter.

In accordance with the invention, there is provided an equivalent M-derived filter in which the inductive components of the series arms are closely coupled inductively so that the resulting mutual inductance forms a circuit element of the shunt arm. Also, there is included an electro-mechanical vibratory element, such as a magnetostrictive device mounted for excitation by the mutually coupled inductive components to form another circuit element of the shunt arm. In accordance with a further feature of the present invention, the series arms may include another pair of inductively coupled inductive components so connected that the mutual inductance thereof is opposed to and is less than the mutual inductance of the first pair of inductive components, whereby the net effective inductance in the shunt arm is less than the mutual inductance of either pair of the inductive components.

Figure 2:
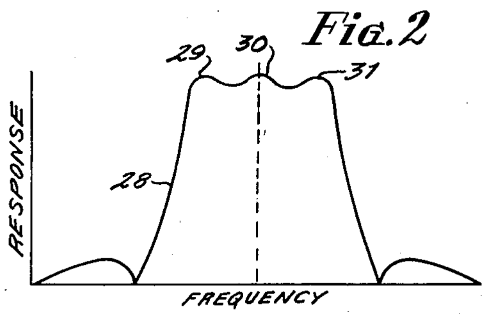
Figure 3:
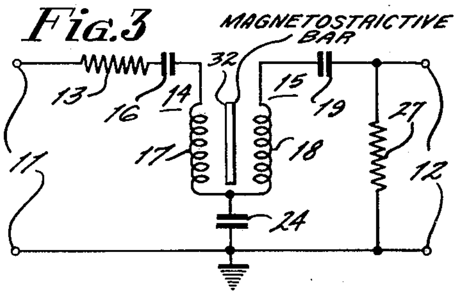
Figure 4:
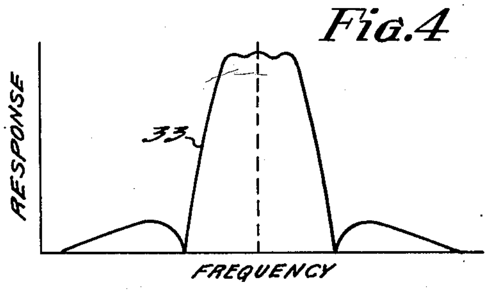
Figure 5:
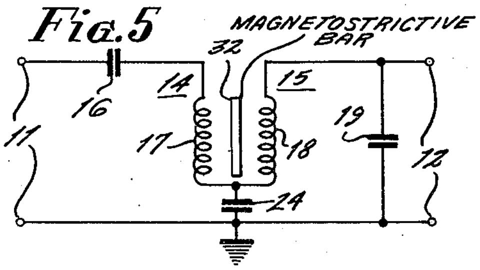
Figure 6:
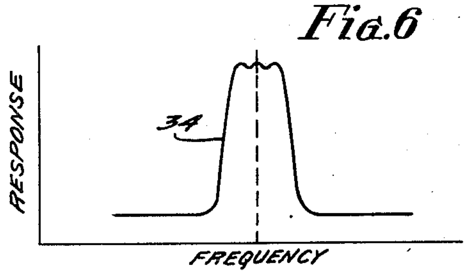
Figure 7:
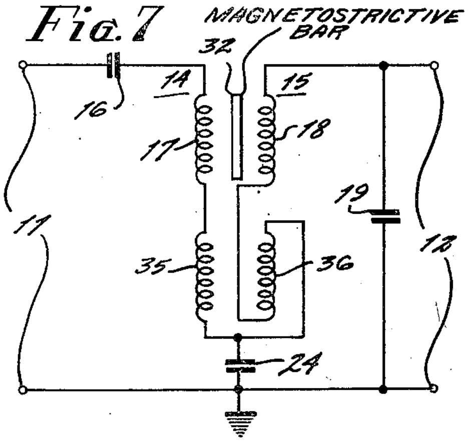
Figure 8:
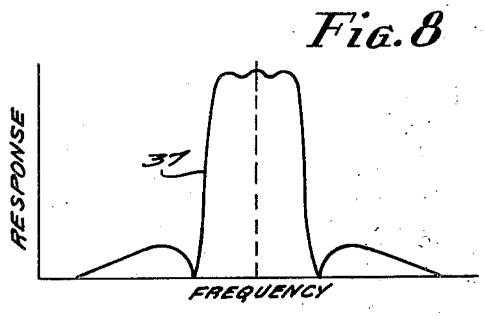

The novel features that are considered characteristic of this invention are set forth with particularity in the appended claims. The invention itself, however, both as to its organization and method of operation as well as additional objects and advantages thereof will best be understood from the following description taken in connection with the accompanying drawing, In the drawing, Figure 1 illustrates a conventional M-derived filter which is the equivalent of the various modifications of the band pass filters in accordance with the present invention;

Figure 2 is a curve depicting the response characteristic of the conventional M-derived filter of Figure 1;

Figures 3 and 4 respectively illustrate one form of a band pass filter in accordance with this invention and its response characteristic;

Figures 5 and 6 respectively illustrate another form of a band pass filter in accordance with this invention and its response characteristic; and Figures 7 and 8 respectively show a third modification of a band pass filter in accordance with this invention and its response characteristic.

Referring now to Figure 1 of the drawing, a conventional band pass filter is coupled between input terminals 11 and output terminals 12. The filter includes a series resistor 13 and two series arm meshes 14 and 15 comprising respectively a capacitor 16, a coil or inductor 17, a coil or inductor 18 and a capacitor 19. The filter also includes two shunt arm meshes 21 and 22 connected in series between the junction point of the series arm meshes 14 and 15 and the grounded input and output terminals 11 and 12. The shunt arm mesh 21 comprises a series resonant circuit including a coil or inductor 23 and a capacitor 24. The other shunt arm mesh 22 comprises a parallel resonant circuit including a coil or inductor 25 and a capacitor 26. Finally, the band pass filter includes a resistor 27 connected in shunt across the output terminals 12.

The filter meshes 14, 15, 21 and 22 are separately tuned to the center frequency of the pass band. At a frequency lower than the center frequency the shunt arm mesh 21 acts like a capacitance and the shunt arm mesh 22 acts like an inductance so that, at this lower frequency, there is provided a series resonant shunt path to ground from the junction point between the series arm meshes 14 and 15. The frequency at which this shunt circuit is effective determines the lower limiting or cutoff frequency of the filter. At a frequency higher than the center frequency of the pass band, the mesh 21 acts like an inductance and mesh 22 acts like a capacitance so that, at this higher frequency a similar series resonant shunt circuit to ground is provided from the junction point between the series arm meshes 14 and 15. The frequency at which this shunt circuit is effective in this manner determines the higher limiting or cutoff frequency of the filter.

In Figure 2, the curve 28 graphically represents a typical response characteristic of the conventional band pass filter of Figure 1 which, as will be pointed out, has practical undesired limitations. It is noted that this curve has three peaks 29, 30 and 31 of substantially equal amplitudes and that the skirts of the curve are reasonably steep. In order to construct a band pass filter having even as good a response curve as this, however, it is necessary that the shunt arm meshes 21 and 22 have Q's several times greater than the Q's of the series arm meshes 14 and 15. It has been found to be extremely difficult to obtain coils for use as the coils 23 and 25 which will have sufficiently high Q's for use in a filter of this character when the ratio of the mean or center frequency of the pass band to the overall band width is as great as 20, for example. As a matter of fact, the curve 28 of Figure 2 represents the optimum performance that may be expected from a conventional band pass filter such as that shown in Figure 1. Where the center frequency such as represented by the peak 30 is of the order of 500 kilocycles, the band width represented by the skirts of the curve 28 is approximately 20 percent or more of the center frequency. For many purposes, it is desirable to have a band width which is no greater than 5 per cent of the mean frequency. It will be appreciated that such performance is not easily realizable by use of a conventional filter such as that shown in Figure 1.

Having reference now to Figure 3, there is shown one form of band pass filter in accordance with the present invention. In this case, the coils 17 and 18 of the series arm meshes 14 and 15 respectively are mutually coupled in quite close relationship to form in effect a transformer, the core of which is an electro-mechanical vibratory element, such as a magnetostrictive bar 32. Therefore, the bar 32 is directly inductively coupled to the coils 17 and 18. Preferably, this bar is formed of a good magnetostrictive material such as magnesium and zinc ferrite. The dimensions of this bar preferably are so chosen that it will resonate substantially at the center frequency of the band of frequencies to be passed by the filter.

It will be seen that the band pass filter in accordance with the invention eliminates the shunt arm coils 23 and 25 and also the capacitor 26 of the conventional filter shown in Figure 1. It also requires only the addition of the magnetostrictive bar 32. In operation, the inductance corresponding to that represented by the coil 23 of Figure 1 is formed by the mutual inductance between the coils 17 and 18 of Fig. 3. The shunt arm rejector mesh 22 of Figure 1 is replaced by the mechanical resonance of the magnetostrictive bar 32. Since the inductance which is equivalent to that contributed by the coil 23 of Figure 1 is the mutual inductance between the coils 17 and 18 of Figure 3, it is seen that this mutual inductance constitutes a low loss circuit element or one having a relatively high Q. Also, the magnetostrictive bar 32 has a relatively high Q and, since both of these elements are included in the shunt arm meshes of the filter, it is seen that they meet the requirements of such a circuit in a more satisfactory manner than the shunt arm meshes 21 and 22 of Figure 1.

The curve 33 of Figure 4 is a typical response curve of the form of the invention shown in Figure 3. It will be seen that this also is a curve having a relatively sharp cutoff at both of the limiting frequencies of the pass band. It has been found that, when using a band pass filter such as that disclosed in Figure 3, the band width is approximately 5 percent of the mean or center frequency.

Another form of the invention is shown in Figure 5. This embodiment is somewhat similar to the form shown in Figure 3 with the exceptions that the resistors 13 and 27 of Figure 3 are not included and the capacitor 19, which together with the coil 18 forms one of the series arm meshes is, in this instance, connected in shunt across the output terminals 12. The shunt arm circuit of the filter functions in a manner substantially similar to that of the shunt arm circuit of Figure 3.

Figure 6 shows a response curve 34 for the form of the invention shown in Figure 5. It will be noted that the band width of the filter is approximately 2 percent of the mean frequency which may be somewhat narrower than desired for many purposes. Also, it will be observed from the curve 34 that this form of band pass filter does not effect complete attenuation of all frequencies outside of the pass band. Nevertheless, for many applications it does have distinct advantages over prior art types of band pass filters, such as that represented in Figure 1.

Still another form of the invention is shown in Figure 7. This modification is of somewhat the same general form as that shown in Figure 5. In the embodiment of Figure 5 it may be found difficult to obtain tight enough coupling to the magnetostrictive bar without having the mutual inductance between the coils 17 and 18 larger than desired. In the embodiment of Figure 7 this is taken care of by the provision of an additional transformer comprising coils 35 and 36 connected in series respectively with the coils 17 and 18. In this case, however, the coupling between the coils 35 and 36 is reversed to that of the coils 17 and 18. This allows the mutual inductance (corresponding to the inductance of the coil 23 of Figure 1) to be reduced to the desired value without affecting the value of shunt arm mesh corresponding to the elements 25 and 26 of Figure 1.

In Figure 7 the inductance corresponding to the inductance of the coil 23 of Figure 1, is the combined mutual inductance of the coils 17 and 18 and the mutual inductance of the coils 35 and 36. Thus, by reversing the coupling of the coils 35 and 36 as shown, the mutual inductance thereof is of opposite sign to the mutual inductance of the coils 17 and 18. Also, the inductance of the windings 35 and 36 was made somewhat less than the inductance of the coils 17 and 18 and the coils 35 and 36 were somewhat more tightly coupled than the coils 17 and 18. Consequently, the mutual inductance of the coils 35 and 36 was made sufficiently less than the mutual inductance of the coils 17 and 18 so that the net effective inductance of this portion of the shunt arm circuit, which is equivalent to the coil 23 of Figure 1, was made sufficiently less than in the form of the invention shown in Figure 5 so as to provide the desired effective value of inductance.

Figure 8 illustrates by means of a curve 37 the response characteristic of the form of the invention shown in Figure 7. From this curve it will be seen that it is of the three peaked character, particularly when the coils employed in the shunt arm circuit have sufficiently high Q's, and also it has relatively sharp cutoffs at the limiting frequencies of the pass band. In this case, the pass band was somewhat less than 5 percent of the mean frequency. It also has been found that, even with coils of somewhat lower Q's, the three peaked response curve may not be realized in all cases but the filter will have substantially the same sharp cutoffs at the limiting frequencies.

It may be seen, therefore, from the foregoing description of several illustrative embodiments of the invention that there is provided a materially improved band pass filter which, by the use of a magnetostrictive element as one of the shunt arm circuit elements and by suitably coupling the coils of the series arm meshes so as to take advantage of their mutual inductance, comprises a considerably smaller number of circuit elements than is required in conventional filters of this character. Furthermore, the coils used as the inductive elements may be suitably formed with reasonably high Q's so as to enable the filter in accordance with the invention to function in a much improved manner. Furthermore, such a filter provides a pass band at medium frequencies which is a much smaller percentage of the mean frequency than is possible of attainment by use of conventional band pass filters of the prior art.

In the several practical embodiments of the invention shown respectively in Figures 3, 5 and 7, the band pass filter was designed to operate at a mean frequency of approximately 480 kilocycles. Such filters used as the magnetostrictive bar 32, one having the following dimensions: 0.271'' x 0.1'' x 0.0625''. The coils 17 and 18 were universal windings using three No. 41 Litz wire, $\frac{3}{32}$'' wide, wound on a ⅛'' diameter form, the coils having an outside diameter of ⅝''. They were placed approximately $\frac{1}{8}$'' apart on the supporting form and the magnetostrictive bar was centered on the common axis of the coils. Capacitors 16 and 19 were 120 micromicrofarads each. The capacitor 24 was 2500 micromicrofarads.

It will be obvious to those skilled in the art that the present invention may be embodied in forms other than those specifically disclosed herein for illustrative purposes. Accordingly, the scope of the present invention is to be determined by reference to the appended claims.

What is claimed is:

1. A band pass filter having a pair of input terminals and a pair of output terminals, comprising a pair of serially connected inductors having the terminals thereof coupled respectively to corresponding ones of said input and output terminals, a resonating capacitor connected to each of said inductors, said capacitors being coupled respectively to said input and output terminals and forming with the respective associated inductors series arm meshes each of which is resonant at the center frequency of said pass band, a capacitor coupled between the junction point of said inductors and corresponding ones of said input and output terminals, said inductors being mutually coupled so that the resulting mutual inductance forms with said shunt arm capacitor one shunt arm mesh which is resonant at said center frequency, and an electro-mechanical resonating element mounted for direct inductive coupling with said inductors and forming another shunt arm mesh which is resonant at said center frequency, said band pass filter including additionally another pair of inductors connected respectively in series with said first mentioned pair of inductors, one of said additional inductors being connected in reverse polarity to the corresponding one of said first mentioned pair of inductors, both of said additional inductors having lower values of inductance than said first mentioned inductors and also being coupled so that the resulting mutual inductance is less than and is of opposite sign to the mutual inductance resulting from the coupling of said first mentioned pair of inductances.

2. A band pass filter, comprising two series arms and a shunt arm symmetrically connected to said series arms, each of said series arms comprising a mesh which includes first and second pairs of inductors and which is resonant at the center frequency of said pass band, said first pair of inductors being coupled so that the resulting mutual inductance is effective in said shunt arm, said second pair of inductors having lower values of inductance than said first inductors and also being coupled more closely than, and in a reverse sense to the coupling of said first pair of inductors, so that the resulting mutual inductance also is effective in said shunt arm in opposition to the mutual inductance of said first pair of inductors, whereby to produce a net effective inductance in said shunt arm of a lower value than either of the mutual inductances produced by the respective couplings of said first and second pairs of inductors, a capacitor included in said shunt arm and forming with said net effective mutual inductance a mesh which is resonant at said center frequency, and an electro-mechanical vibratory element mounted for excitation by one pair of said inductors and forming another mesh in said shunt arm which is resonant at said center frequency.

3. A band pass filter as defined in claim 2, in which all of said inductors are connected in series with one of said second inductors having a reverse polarity, and said electro-mechanical vibratory element being mounted for excitation by said first pair of inductors.

4. A band pass filter as defined in claim 3, in which both of said second pair of inductors are connected directly together and the inductors of said first pair are connected respectively to corresponding ones of said second pair of inductors, said capacitor being connected to the junction point between said second pair of inductors.

5. A band pass filter having input and output terminals, comprising two pairs of inductors connected in series with one of the inductors of one of said pairs being connected in opposite polarity to the other inductors and said series connection of said inductors being coupled between corresponding ones of said input and output terminals, each pair of said inductors being mutually coupled so that the resulting mutual inductance is effective in a shunt arm of said filter, the two pairs of inductors being related to one another in inductance values in such a manner that the two resulting mutual inductances are of different values so that by reason of the reverse connection of one of said inductors there is produced a net effective mutual inductance in said shunt arm having a value less than that of either of said mutual inductances, a capacitor connected between the junction point of said serially connected inductors and the opposite ones of said input and output terminals forming with said net effective mutual inductance a shunt arm mesh which is resonant at the center frequency of said pass band, and an electro-mechanical vibratory element mounted for excitation by one pair of said inductors and forming another shunt arm mesh which also is resonant at said center frequency.

VERNON D. LANDON.

References Cited in the file of this patent

UNITED STATES PATENTS

| Number | Name | Date |
|---|---|---|
| 1,624,665 | Johnson et al. | Apr. 12, 1927 |
| 2,115,818 | Lakatos | May 3, 1938 |
| 2,166,359 | Lakatos | July 18, 1939 |
| 2,435,487 | Adler | Feb. 3, 1948 |

OTHER REFERENCES

Book "Transmission Networks and Wave Filters" by T. E. Shea, Van Nostrand Co., Inc., 1929.